(12) United States Patent
Nagamochi et al.

(10) Patent No.: US 11,981,129 B2
(45) Date of Patent: May 14, 2024

(54) ELEMENT SUBSTRATE, LIQUID DISCHARGE HEAD, AND PRINTING APPARATUS

(71) Applicant: CANON KABUSHIKI KAISHA, Tokyo (JP)

(72) Inventors: Soichiro Nagamochi, Kanagawa (JP); Toshio Negishi, Kanagawa (JP); Yasuhiro Soeda, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 161 days.

(21) Appl. No.: 17/691,281

(22) Filed: Mar. 10, 2022

(65) Prior Publication Data

US 2022/0288924 A1 Sep. 15, 2022

(30) Foreign Application Priority Data

Mar. 12, 2021 (JP) .................. 2021-040697

(51) Int. Cl.
*B41J 2/045* (2006.01)
*G11C 17/16* (2006.01)
*G11C 17/18* (2006.01)

(52) U.S. Cl.
CPC ....... *B41J 2/04541* (2013.01); *B41J 2/04536* (2013.01); *B41J 2/04586* (2013.01); *G11C 17/16* (2013.01); *G11C 17/18* (2013.01)

(58) Field of Classification Search
CPC .............. B41J 2/04541; B41J 2/04536; B41J 2/04586; B41J 2/04543; B41J 2/04546; B41J 2/0455; B41J 2/0458; B41J 2/04523; B41J 2/14; B41J 2202/13; G11C 17/16; G11C 17/18; G11C 17/165; H10B 20/20

USPC ........................................................... 347/14
See application file for complete search history.

(56) References Cited

U.S. PATENT DOCUMENTS

| 7,309,120 B2 | 12/2007 | Hatsui et al. | |
| 10,201,969 B2 | 2/2019 | Negishi et al. | |
| 2004/0217998 A1* | 11/2004 | Hayasaki | B41J 2/04543 347/12 |

(Continued)

FOREIGN PATENT DOCUMENTS

| JP | 2006-15736 A | 1/2006 |
| JP | 2018-134809 A | 8/2018 |

OTHER PUBLICATIONS

U.S. Appl. No. 17/691,291, filed Mar. 10, 2022 (avalaible on USPTO system).

*Primary Examiner* — Jason S Uhlenhake
*Assistant Examiner* — Alexander D Shenderov
(74) *Attorney, Agent, or Firm* — VENABLE LLP

(57) ABSTRACT

An element substrate comprises a plurality of stages of shift registers that inputs and holds a serial data signal; a latch circuit that latches the serial data held by the shift registers; a decoder circuit that inputs an output of the latch circuit and outputs a selection signal for selecting a block of the print elements or the memory elements; and a mask circuit that masks the output of the selection signal for selecting the block of the memory elements from the decoder circuit in accordance with an input bit data signal. The block of the print elements or the memory elements includes a plurality of print elements or memory elements in which one element is selected in each of the plurality of groups.

18 Claims, 9 Drawing Sheets

(56) References Cited

U.S. PATENT DOCUMENTS

2007/0091131 A1 4/2007 Hatsui et al.
2018/0236762 A1 8/2018 Negishi et al.

\* cited by examiner

ELEMENT SUBSTRATE, LIQUID DISCHARGE HEAD, AND PRINTING APPARATUS

BACKGROUND OF THE INVENTION

Field of the Invention

The present invention relates to an element substrate including a print element and a memory element, a liquid discharge head including the element substrate, and a printing apparatus that performs printing using the liquid discharge head.

Description of the Related Art

In recent years, after completion of a product, an OTP (One Time Programmable) memory configured to record various kinds of product-specific information such as a chip ID, setting parameters, and an aging state in use of a product is mounted on a semiconductor substrate. There are two types of OTP memories, that is, one type using a Poly fuse element and the other type using an anti-fuse memory AF. The memory using the anti-fuse element can make the memory module smaller as compared to a conventional Poly fuse memory, and is advantageous in saving the space of the semiconductor substrate.

Additionally, a liquid discharge head including a semiconductor substrate described in Japanese Patent Laid-Open No. 2018-134809 is provided with one selection circuit including a shift register circuit and a latch circuit to further save the space of the semiconductor substrate. It is described that the selection circuit can be used for both selection of a print element and selection of an anti-fuse element.

SUMMARY OF THE INVENTION

The present invention provides a technique of suppressing an increase in the amount of data to be supplied to an element substrate to select a print element at the time of a printing operation.

The present invention in one aspect provides an element substrate comprising: a plurality of groups of print elements; a plurality of groups of memory elements; a plurality of stages of shift registers configured to input and hold a serial data signal; a latch circuit configured to latch the serial data held by the shift registers; a decoder circuit configured to input an output of the latch circuit and output a selection signal for selecting a block of the print elements or the memory elements; and a mask circuit configured to mask the output of the selection signal for selecting the block of the memory elements from the decoder circuit in accordance with an input bit data signal, wherein the block of the print elements or the memory elements includes a plurality of print elements or memory elements in which one element is selected in each of the plurality of groups.

According to the present invention, it is possible to suppress an increase in the amount of data to be supplied to an element substrate to select a print element at the time of a printing operation.

Further features of the present invention will become apparent from the following description of exemplary embodiments with reference to the attached drawings.

DESCRIPTION OF THE EMBODIMENTS

Figure 1:
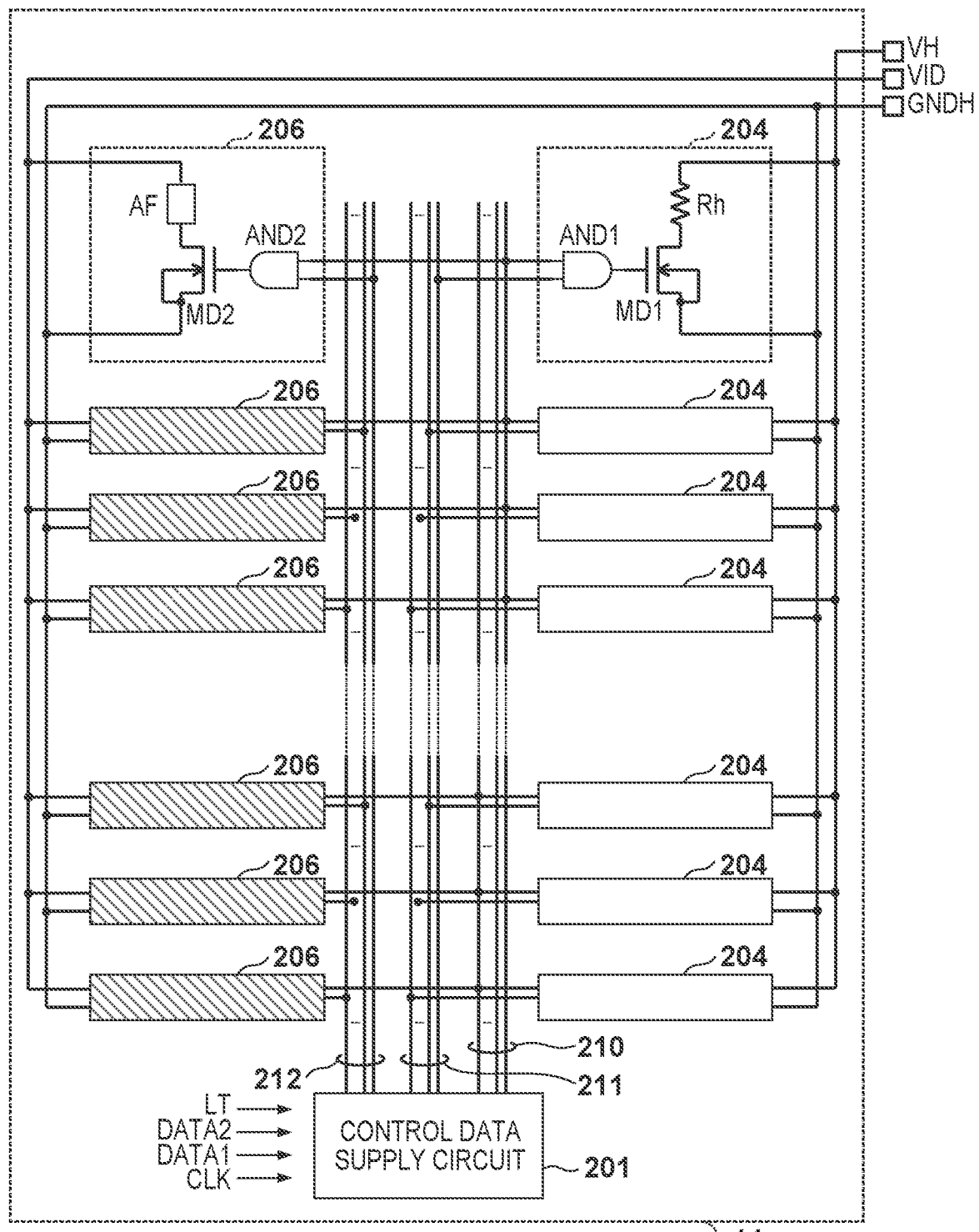
FIG. 1 is a view showing a part of the circuit configuration of a print element substrate according to the embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

In the example described in Japanese Patent Laid-Open No. 2018-134809, however, it is necessary to determine one of a mode for selecting a print element and a mode for selecting an anti-fuse element. For this determination, signal data of at least 1 bit is needed. For this reason, every time a print element or an anti-fuse element is selected, the signal data amount increases.

In particular, when performing printing using print elements, if the signal data amount increases, time for selecting a print element increases, and as a result, the print speed lowers.

According to the following embodiment, it is possible to suppress an increase in the amount of data to be supplied to an element substrate to select a print element at the time of a printing operation.

Note that "print" includes not only formation of significant information such as a character or graphic pattern but also formation of an image, design, or pattern on print media in a broader sense and processing of print media regardless of whether the information is significant or insignificant or has become obvious to allow human visual perception. Also, in this embodiment, "print medium" is assumed to be sheet-shaped paper but may be a fabric, a plastic film, or the like.

Figure 6A:
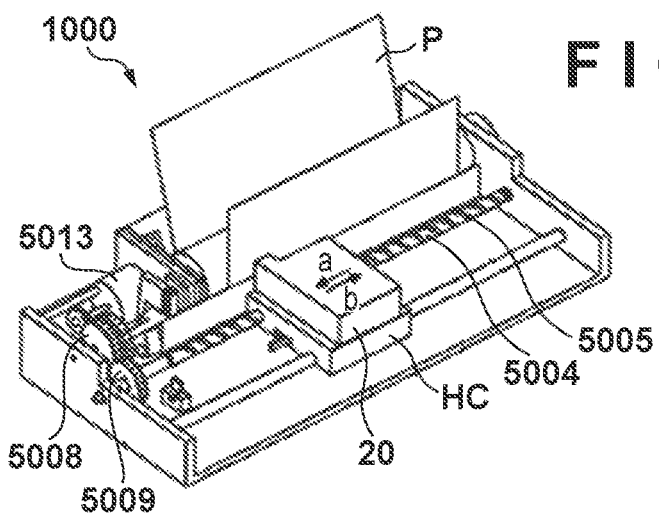
FIGS. 6A to 6C are views for explaining an inkjet printing apparatus, a printhead unit, and a printhead according to the embodiment of the present invention.
Figure 6B:
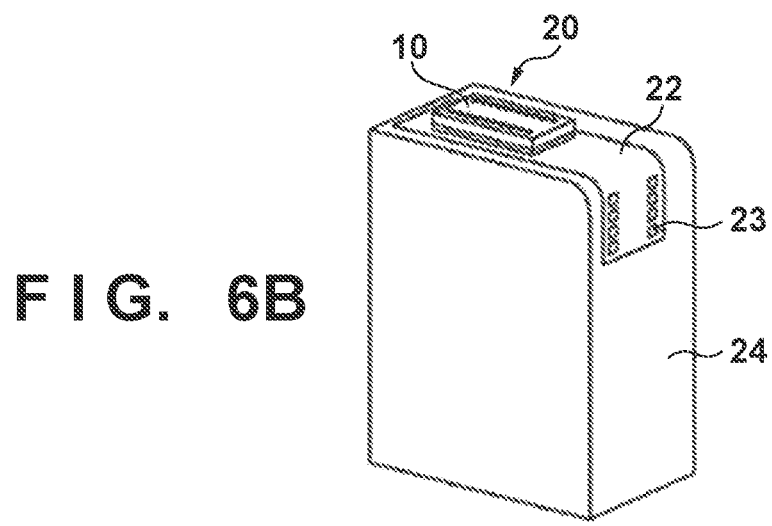
Figure 6C:
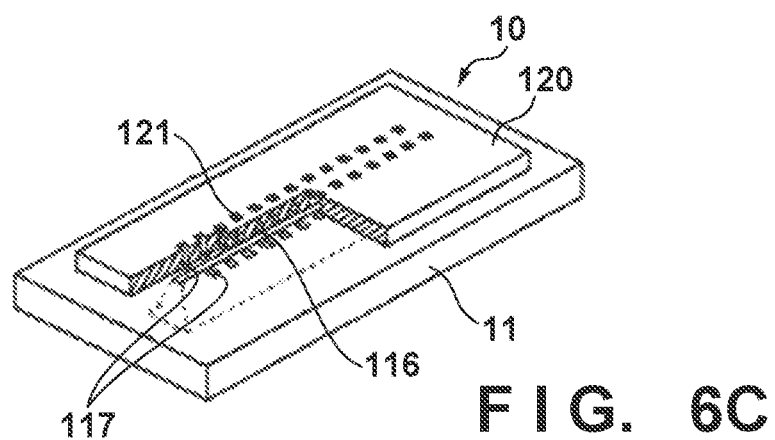

FIGS. 6A to 6C are views for explaining an inkjet printing apparatus 1000, a printhead unit 20, and a printhead 10 according to the embodiment of the present invention.

FIG. 6A is a schematic perspective view of the inkjet printing apparatus 1000 according to the embodiment. As shown in FIG. 6A, interlocking with forward and reverse rotation of a driving motor 5013, a lead screw 5004 rotates via driving force transmission gears 5008 and 5009. The printhead unit 20 can be placed on a carriage HC. The carriage HC includes a pin (not shown) configured to engage with a helical groove 5005 of the lead screw 5004, and reciprocally moves in the directions of arrows a and b in FIG. 6A as the lead screw 5004 rotates.

FIG. 6B is a perspective view showing an example of the printhead unit 20 including the printhead 10 according to the embodiment.

The printhead unit 20 includes the printhead 10, and a storage unit 24 that stores a printing material (liquid; ink) to be supplied to the printhead 10, and constitutes a cartridge by integrating these. Here, the printhead 10 is provided on a surface facing a print medium P shown in FIG. 6A. Note that these need not always be integrated, and a form that allows the storage unit 24 to be detached can also be employed. In addition, the printhead unit 20 includes a tape member 22. The tape member 22 includes a terminal configured to supply power to the printhead 10, and receives power from the main body of the inkjet printing apparatus 1000 via a contact 23, and also exchanges various kinds of signals.

FIG. 6C is a schematic perspective view of the printhead 10 according to the embodiment.

The printhead 10 serving as a liquid discharge head includes a print element substrate 11 and a channel forming member 120. The print element substrate 11 is provided with a plurality of arrays of heat action units 117 configured to apply thermal energy generated by electrothermal transducers to the printing material. The channel forming member 120 also serves as an orifice member in which a plurality of arrays of orifices 121 configured to discharge the printing material are provided in correspondence with the heat action units 117. Power and signals are sent from the main body of the printing apparatus 1000 to the print element substrate 11 via the tape member 22, thermal energy generated by driving the electrothermal transducers is applied to the printing material (liquid) via the heat action units 117, and the printing material is discharged from the orifices 121.

Figure 9:
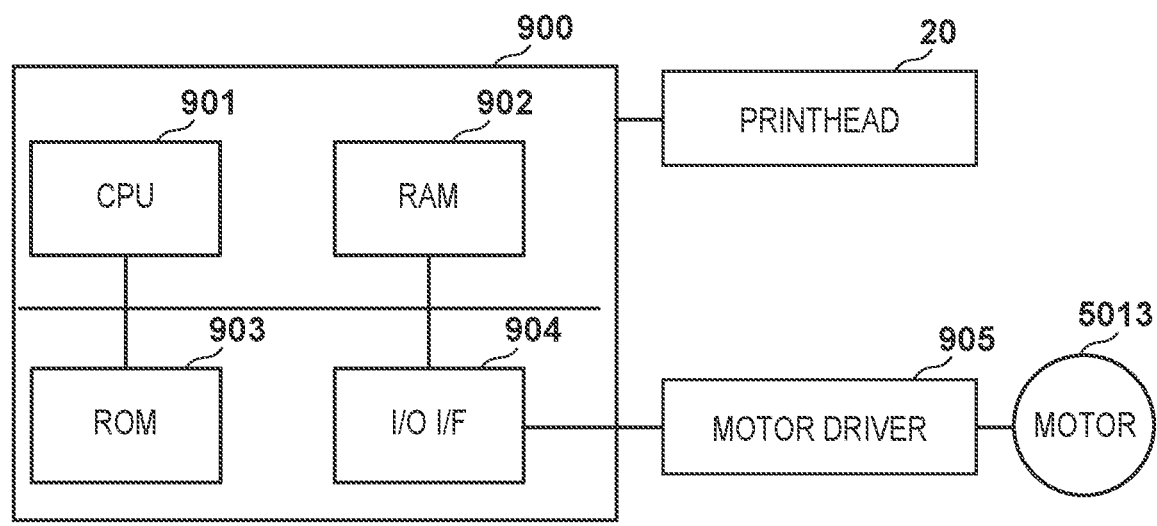
FIG. 9 is a block diagram showing the schematic configuration of a printing apparatus according to the embodiment.

FIG. 9 is a block diagram showing the schematic configuration of the printing apparatus 1000 according to the embodiment.

A controller 900 controls the operation of the printing apparatus 1000. The controller 900 includes a CPU 901, a RAM 902, a ROM 903, and an input/output interface (I/O I/F) 904. The CPU 901 reads out a program stored in the ROM 903 and executes the program, thereby executing processing shown in a flowchart to be described later. Also, the CPU 901 controls various kinds of operations of the printing apparatus 1000 such as print processing. The input/output interface (I/O I/F) 904 is connected to a motor driver 905 that rotationally drives a conveyance motor 5013 described above. Note that the printing apparatus 1000 according to the embodiment further includes an operation panel, various kinds of sensors, a paper feeding unit, and the like will be omitted here.

The circuit configurations of a discharge module and a memory module mounted on the print element substrate 11 (to be also simply referred to as a "substrate 11" hereinafter) as a semiconductor substrate according to the embodiment of the present invention will be described next with reference to FIGS. 1 to 3.

FIG. 1 is a view showing a part of the circuit configuration of the print element substrate 11 according to the embodiment.

The substrate 11 includes discharge modules 204 and memory modules 206. The discharge module 204 includes a print element Rh (for example, an electrothermal transducer that generates heat by energization), a driving element (transistor) MD1 for print element, which is configured to drive the print element Rh, and an AND circuit AND1 for print element selection. When the output of the AND circuit AND1 changes to high level to turn on the driving element MD1, and the print element Rh is energized and driven, a printing material such as ink is discharged from the orifice 121, thereby performing printing.

Also, the memory module 206 includes an anti-fuse element AF serving as a memory element, a driving element MD2 for memory element, which is configured to write information to the anti-fuse element AF, and an AND circuit AND2 for memory element selection. When an overvoltage is supplied, the anti-fuse element AF stationarily holds information, and functions as a memory that can be programmed only once.

Based on logic data signals output from a control data supply circuit 201 that is a signal supply circuit, driving of the print element Rh or the anti-fuse element AF is controlled. As will be described later in detail with reference to FIG. 7, the control data supply circuit 201 includes a first shift register circuit 501, a second shift register circuit 502, latch circuits 503 and 504, a data mask circuit 505, a decoder circuit 506, and the like. Logic data signals such as a clock signal CLK, a serial data signal DATA1, a bit data signal DATA2 for anti-fuse switching, a latch signal LT, and a print element control signal HE (heat enable signal: now shown) can be input to the control data supply circuit 201 via the main body of the printing apparatus 1000 or a host PC (not shown). In addition, a first power supply voltage VDD (for example, 3 to 5 V) is supplied as a logic power supply voltage to the AND circuit AND1, the AND circuit AND2, and the control data supply circuit 201.

Here, in each of, for example, m groups each including n discharge modules 204, the control data supply circuit 201 selects one of the discharge modules 204 included in each group in a predetermined order and drives the print element Rh (performs so-called time division driving). The control data supply circuit 201 outputs an m-bit group selection signal 210 and an n-bit block selection signal 211. Each discharge module 204 receives at least 1 bit of the group selection signal 210 and at least 1 bit of the block selection signal 211, thereby time-divisionally driving the print elements Rh.

In addition, the control data supply circuit 201 controls the memory module 206 in each of y groups each including x memory modules 206, thereby performing time division driving control of the anti-fuse element AF. More specifically, each memory module 206 receives at least 1 bit of each of the group selection signal 210 and block selection signal 212, thereby time-divisionally driving the anti-fuse elements AF. At this time, the discharge modules 204 and the memory module 206 are exclusively driven, and are logically configured such that all the print elements Rh and all the anti-fuse elements AF are not driven at the same time.

The corresponding group selection signal 210, block selection signal 211, and print element control signal HE are input to the AND circuit AND1 for print element selection. When the output of the AND circuit AND1 is turned on in response to the input signals, the corresponding driving element MD1 for memory element is set in a conductive state, and the print element Rh connected in series with the driving element MD1 for print element is driven.

Here, as the driving element MD1 for print element, for example, a DMOS transistor (Double-diffused MOSFET) that is a high breakdown voltage transistor is used. In the anti-fuse memory, generally, the driving current of the memory element is smaller than the driving current of the print element, and the current driving capability of the DMOS transistor can also be small. Hence, the area of the driving element MD2 for memory element may be smaller than the area of the driving element MD1 for print element.

In addition, as the AND circuit AND1 for print element selection, for example, a MOS transistor is used. Here, a second power supply voltage VH (for example, 24 V) is supplied to the discharge module 204 as a power supply voltage for print element driving, and the ground potential is defined as GNDH.

In addition, the corresponding group selection signal 210, block selection signal 212, and memory element control signal ME (not shown) are input to the AND circuit AND2 for memory element selection. A signal according to the input signals is output to the driving element MD2 for memory element, and the conductive state/non-conductive state of the driving element MD2 is switched. As the driving element MD2 of memory element, a DMOS transistor is used, like the driving element MD1 for print element. Also, as the AND circuit AND2 for memory element selection, a MOS transistor is used. A third power supply voltage VID (for example, 24 V) used to write information to the anti-fuse element AF is supplied to the memory module 206, and the ground potential is defined as GNDH. As shown in FIG. 1, the driving element MD1 for print element and the driving element MD2 for memory element may be configured to be connected to the common GNDH pad via a common ground wiring.

Note that the power supply voltage VID and the power supply voltage VH are independent power supply lines. However, if the minimum value of a voltage necessary for write to the anti-fuse element AF is equal to or less than the power supply voltage VH, the power supply voltage VH may be used in addition to, for example, a voltage step-down circuit.

Figure 2:
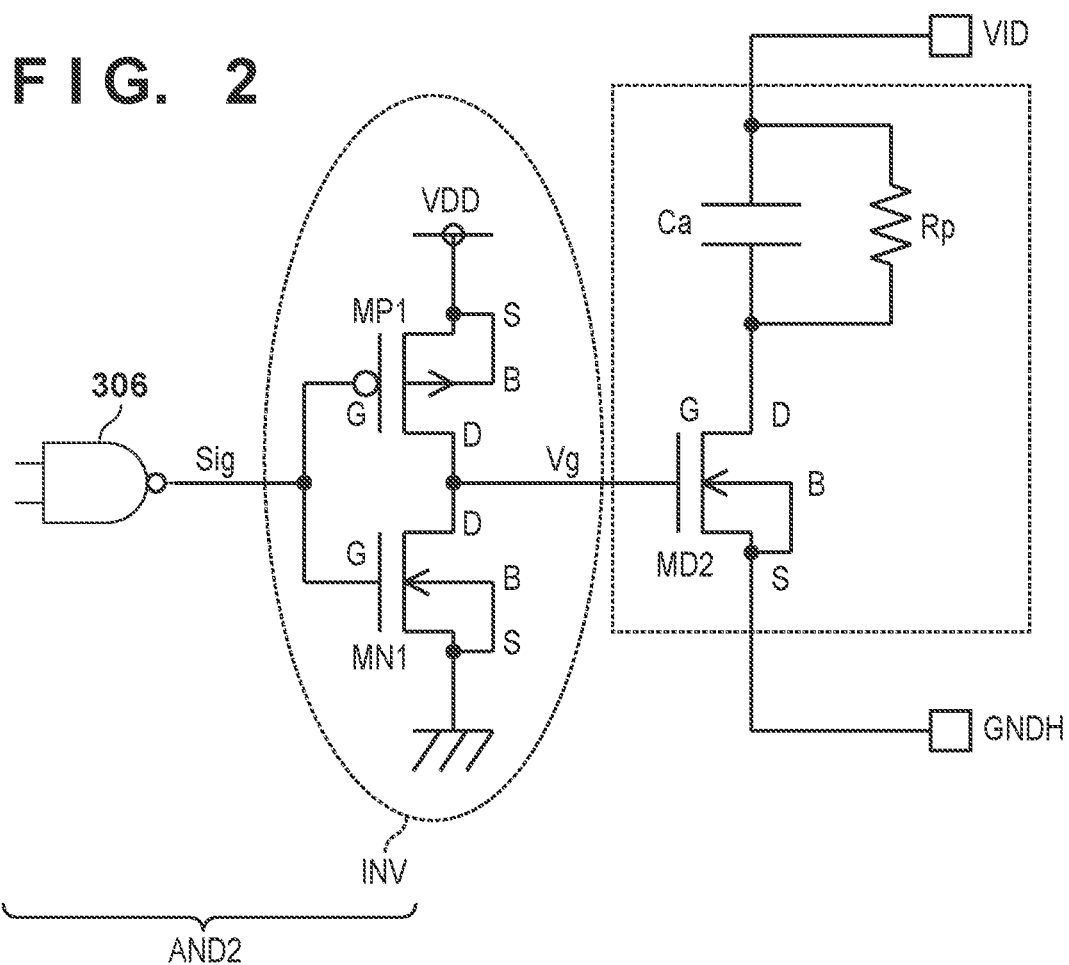
FIG. 2 is a circuit diagram for explaining the configuration of a memory module using in a substrate according to the embodiment.

FIG. 2 is a circuit diagram for explaining the configuration of the memory module 206 used in the substrate 11 according to the embodiment.

Here, the AND circuit AND2 for memory element selection is configured by a NAND circuit 306 and an inverter INV. The inverter INV includes a PMOS transistor MP1 and an NMOS transistor MN1, and MOSFETs are used as the transistors MP1 and MN1. An output signal Sig of the NAND circuit 306 is input to the inverter INV, and an output signal Vg of the AND circuit AND2 is output to the gate of the driving element MD2 for memory. Note that FIG. 2 shows the driving element MD2 and the AND circuit AND2, which are arranged on opposite sides from FIG. 1.

Before writing information, the anti-fuse element AF functions as, for example, a capacitance element Ca. FIG. 2 shows a state before information is written to the anti-fuse element AF, and the anti-fuse element AF is represented as the capacitance Ca. The anti-fuse element AF is sometimes represented as the capacitance element Ca in other drawings as well.

One terminal of the capacitance Ca serving as the anti-fuse element AF is connected in series with the driving element MD2 for memory. In addition, the power supply voltage VID is supplied to the other terminal of the capacitance Ca when writing/reading information.

The memory module 206 also includes a resistive element (having a resistance value Rp, and also simply referred to as a "resistive element Rp" hereinafter) connected in parallel with the anti-fuse element AF. This can prevent a situation that an overvoltage is applied across the anti-fuse element AF, and information is erroneously written to the anti-fuse element AF, although the driving element MD2 for memory element is in a non-conductive state.

Figure 3:
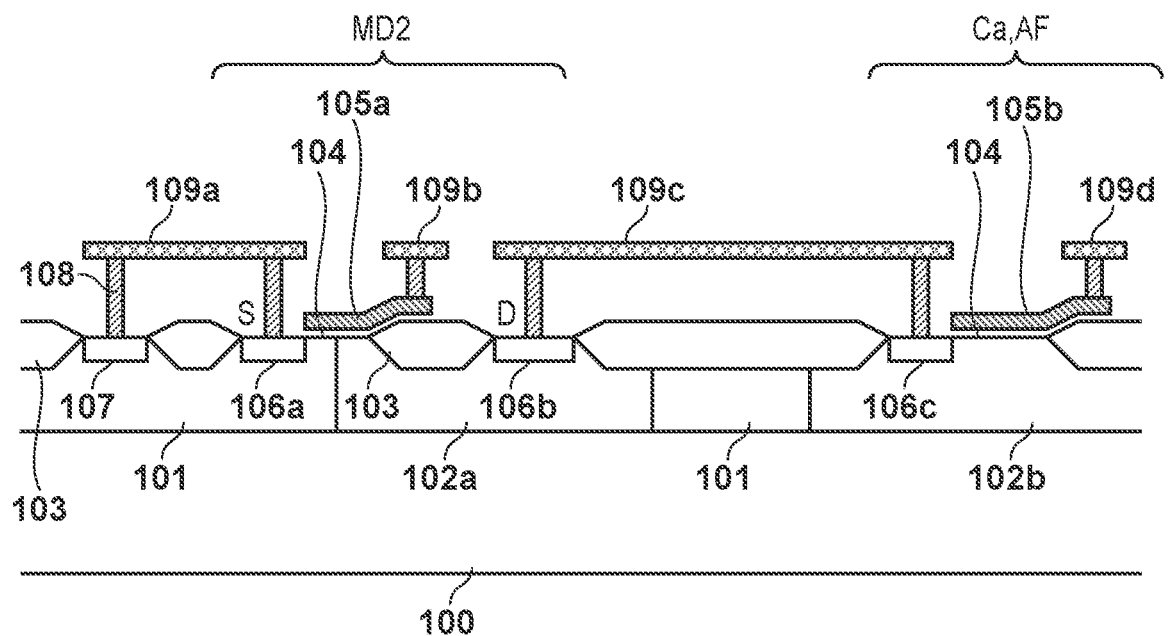
FIG. 3 is a view schematically showing an example of the sectional structure of the substrate in portions corresponding to a capacitance element Ca and a driving element MD2 for memory element according to the embodiment.

FIG. 3 is a view schematically showing an example of the sectional structure of the substrate 11 in portions corresponding to the capacitance element Ca and the driving element MD2 for memory element according to the embodiment.

For example, p-type well regions 101 and n-type well regions 102a and 102b are formed on a p-type silicon substrate 100. The p-type well regions 101 are preferably formed simultaneously in the process of forming the p-type well of the NMOS transistor MN1. The p-type well and the p-type well regions 101 have the same impurity concentration distribution. This also applies to the relationship between the n-type well regions 102a and 102b and the n-type well of the PMOS transistor MP1. Letting VB be the breakdown voltage in the p-n junction between the p-type silicon substrate 100 and the n-type well regions 102a and 102b, VB>VID is set such that a breakdown does not occur in the p-n junction when writing information. Hence, the n-type well regions 102a and 102b are preferably formed in consideration of the impurity concentrations.

Reference numeral 103 denotes a field oxide film having a LOCOS structure. A gate oxide film 104 is formed at the same time as the formation of the gate insulating films of the transistors MP1 and MN1. A gate electrode 105a of the driving element MD2 for memory and an electrode 105b of the capacitance element Ca used as the anti-fuse element AF are made of polysilicon. These are formed at the same time as the formation of the gate electrodes of the transistors MP1 and MN1. Heavily-doped n-type diffusion regions 106a to 106c and a heavily-doped p-type diffusion region 107 are similarly formed at the same time as the formation of heavily-doped diffusion regions for the drains, sources, and bulks of the transistors MP1 and MN1. Reference numeral 108 denotes a contact portion; and 109a to 109d, metal wirings. Note that the manufacturing methods and structures of the metal wirings 109a to 109d and the electrodes are not limited as long as these are electrically connected.

The configuration of a high breakdown voltage NMOS transistor will be described next.

The gate electrode 105a is arranged on the gate oxide film 104 on the p-type well region 101 and the n-type well region 102a, which are adjacent to each other. The region where the p-type well region 101 and the gate electrode 105a overlap is a channel region. The heavily-doped n-type diffusion region 106a is a source electrode, and the heavily-doped p-type diffusion region 107 is a back gate electrode. As the field relaxing region of the drain, the n-type well region 102a extending up to below the gate electrode 105 is arranged. The heavily-doped n-type diffusion region 106b formed in the n-type well region 102a serves as a drain electrode. Also, the drain side of the gate electrode 105a has a structure running onto the field oxide film 103 formed in the n-type well region 102a, that is, a so-called LOCOS offset structure.

Hence, even if the voltage of the drain electrode rises to the high voltage VID in the off state of the high breakdown voltage NMOS transistor, that is, when the voltage of the gate electrode is GND, the gate-drain breakdown voltage can be ensured.

The structure of the anti-fuse element AF will be described next.

The electrode 105b provided on the gate insulating film 104 on the n-type well region 102b is used as the upper electrode of the anti-fuse element AF, and the heavily-doped n-type diffusion region 106c is used as the lower electrode.

In FIG. 2, the heavily-doped n-type diffusion region 106c is formed only in the opening portion of the upper electrode. However, the heavily-doped n-type diffusion region may be formed on the entire region under the upper electrode. Also, in FIG. 2, the lower electrode of the anti-fuse element AF is connected to the drain of the high breakdown voltage NMOS transistor. However, the upper electrode may be connected to the drain of the high breakdown voltage NMOS transistor, and the lower electrode may be connected to the high voltage VID.

Note that the anti-fuse element AF is shown in FIG. 2 as a capacitance formed by the n-type well region and polysilicon, but may be a capacitance using a PMOS transistor.

The connection state of each electrode will be described next.

The metal wiring 109a is connected to the source electrode and the back gate electrode of the high breakdown voltage NMOS transistor via the contact portion 108 and is given the GND potential. The metal wiring 109b is connected to the gate electrode of the high breakdown voltage NMOS transistor via the contact portion 108, and the output signal Vg of the inverter INV shown in FIG. 1 is input. The metal wiring 109c is connected to the drain electrode of the high breakdown voltage NMOS transistor MD1 and the lower electrode of the anti-fuse element AF via the contact portion 108. The metal wiring 109d is connected to the upper electrode of the anti-fuse element AF via the contact portion 108, and is given the high voltage VID at the time of write.

An operation when writing information to the anti-fuse element AF will be described next.

To write information to the anti-fuse element AF, the output signal Sig of the NAND circuit 306 is set to low level, thereby turning on the driving element MD2 for memory. Hence, the high voltage VID is applied to a gate oxide film that forms the anti-fuse element AF. This breaks the gate oxide film, and information is written to the anti-fuse element AF. That is, the anti-fuse element AF is the capacitance element Ca before write, and changes to a resistive element after write.

As a method of reading out information written to the anti-fuse element AF, a method of measuring the change of the impedance of the anti-fuse element AF, or the like can be used.

Information to be written to the anti-fuse element AF is information specific to a product, for example, a chip ID or a setting parameter. These are written using an inspection machine or the like in a factory at the time of product shipment. Alternatively, if the memory is mounted in a product main body, and a user writes information after the start of use of the product, a voltage corresponding to the high voltage VID is supplied from the product main body.

FIRST EMBODIMENT

The first and second embodiments of the present invention will be described based on the above-described assumption.

Figure 7:
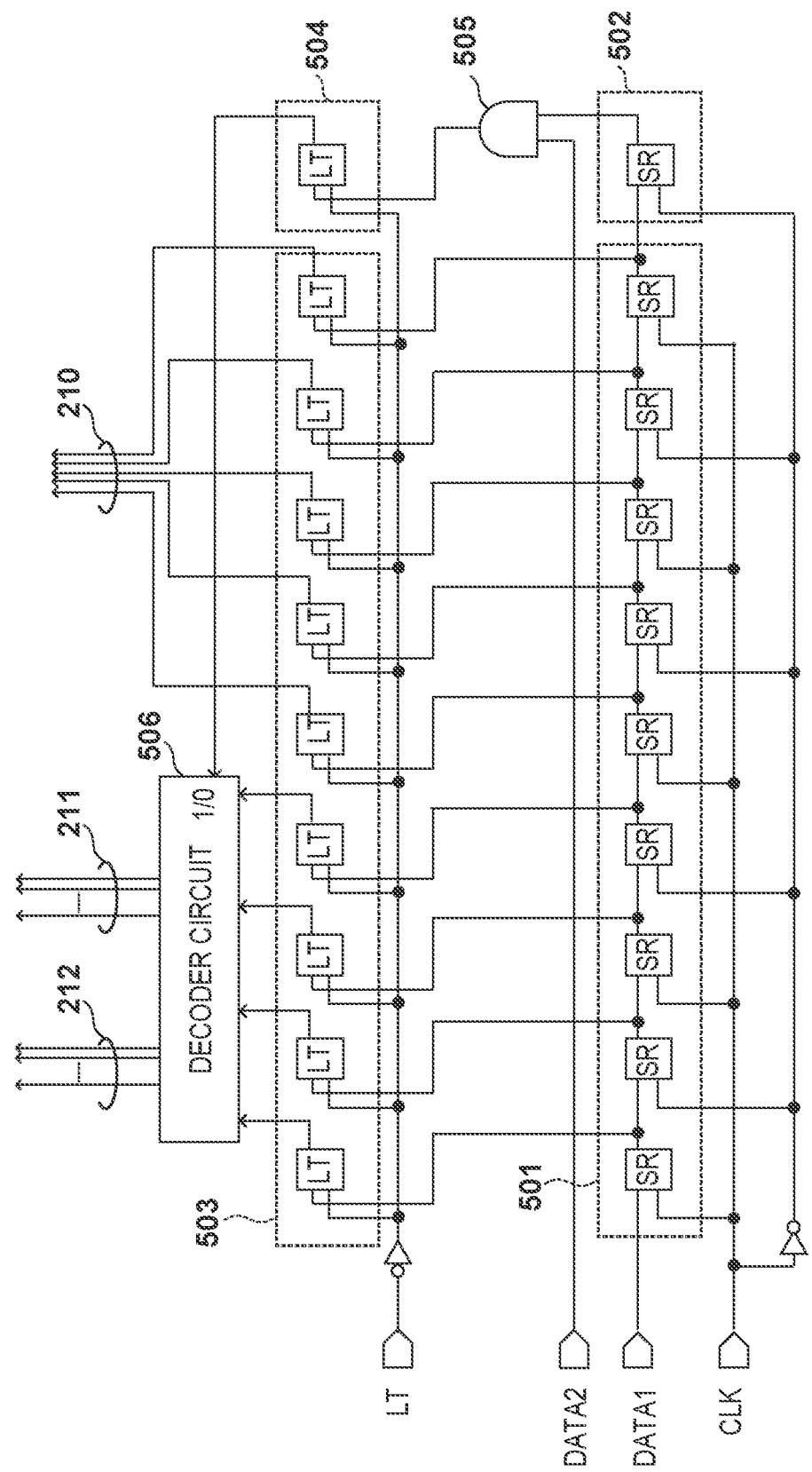
FIG. 7 is a view showing an example of the circuit configuration of a control data supply circuit 201 according to the first embodiment.

FIG. 7 is a view showing an example of the circuit configuration of a control data supply circuit 201 according to the first embodiment.

The control data supply circuit 201 includes a first shift register circuit 501, a second shift register circuit 502, latch circuits 503 and 504, a data mask circuit 505, a decoder circuit 506, and the like described above. Logic data signals such as a clock signal CLK used to transfer data of the shift register circuits 501 and 502, a signal DATA1, a signal DATA2, a signal LT that inputs a latch signal, and a print element control signal (not shown) are input to the input side of the control data supply circuit 201. Signals such as a group selection signal 210, a block selection signal 211 for print element selection, and a block selection signal 212 for memory element selection are output to the output side of the control data supply circuit 201.

The first shift register circuit 501 is formed by a plurality of stages of registers, and the second shift register circuit 502 is formed by one register. The first shift register circuit 501 is connected in series with the second shift register circuit 502. The signal DATA1 that inputs serial data is first input to the first shift register circuit 501, output from the first shift register circuit 501, and input to the second shift register circuit 502.

In addition, the output of each register of the first shift register circuit 501 is connected to the corresponding circuit of the first latch circuit 503. The circuits of the first latch circuit 503 parallelly receive the outputs of the registers of the first shift register circuit 501. Similarly, the output of the second shift register circuit 502 of the first bit is connected to the second latch circuit 504 via the data mask circuit 505.

Also, the decoder circuit 506 receives the outputs from some latch circuits of the first latch circuit 503 and the output from the second latch circuit 504. The data mask circuit 505 sends the output of the second shift register circuit 502 to the second latch circuit 504 only when the signal DATA2 is a high-level signal. When the output is latched by the second latch circuit 504, the output of the second latch circuit 504 is output as the output selection signal of the decoder circuit 506. When the output of the second latch circuit 504, that is, the output selection signal is at high level, the block selection signal 212 for memory element selection is output from the decoder circuit 506.

On the other hand, when the signal DATA2 is at low level, the output of the second shift register circuit 502 is not sent to the second latch circuit 504 via the data mask circuit 505. Hence, in this case, since the output selection signal of high level is not output from the second latch circuit 504 to the decoder circuit 506, the block selection signal 211 for print element selection is output from the decoder circuit 506.

That is, to use the print elements for printing, the signal DATA2 is set to low level independently of the presence/absence of reception of the signal of the second shift register circuit 502, thereby masking the output of the second shift register circuit 502 by the data mask circuit 505. For this reason, the block selection signal 211 for print element is automatically output to select a print element. Hence, in printing, the print elements can be selected using only the first shift register circuit 501. It is therefore possible to suppress an increase in the data amount for selecting a print element, as compared to a conventional technique.

In FIG. 7, one second shift register circuit 502, one data mask circuit 505, and one second latch circuit 504 are provided. However, to selectively use the mode of read/write for a memory element, a plurality of second shift register circuits 502, a plurality of data mask circuits 505, and a plurality of second latch circuits 504 may be used.

Figure 4:
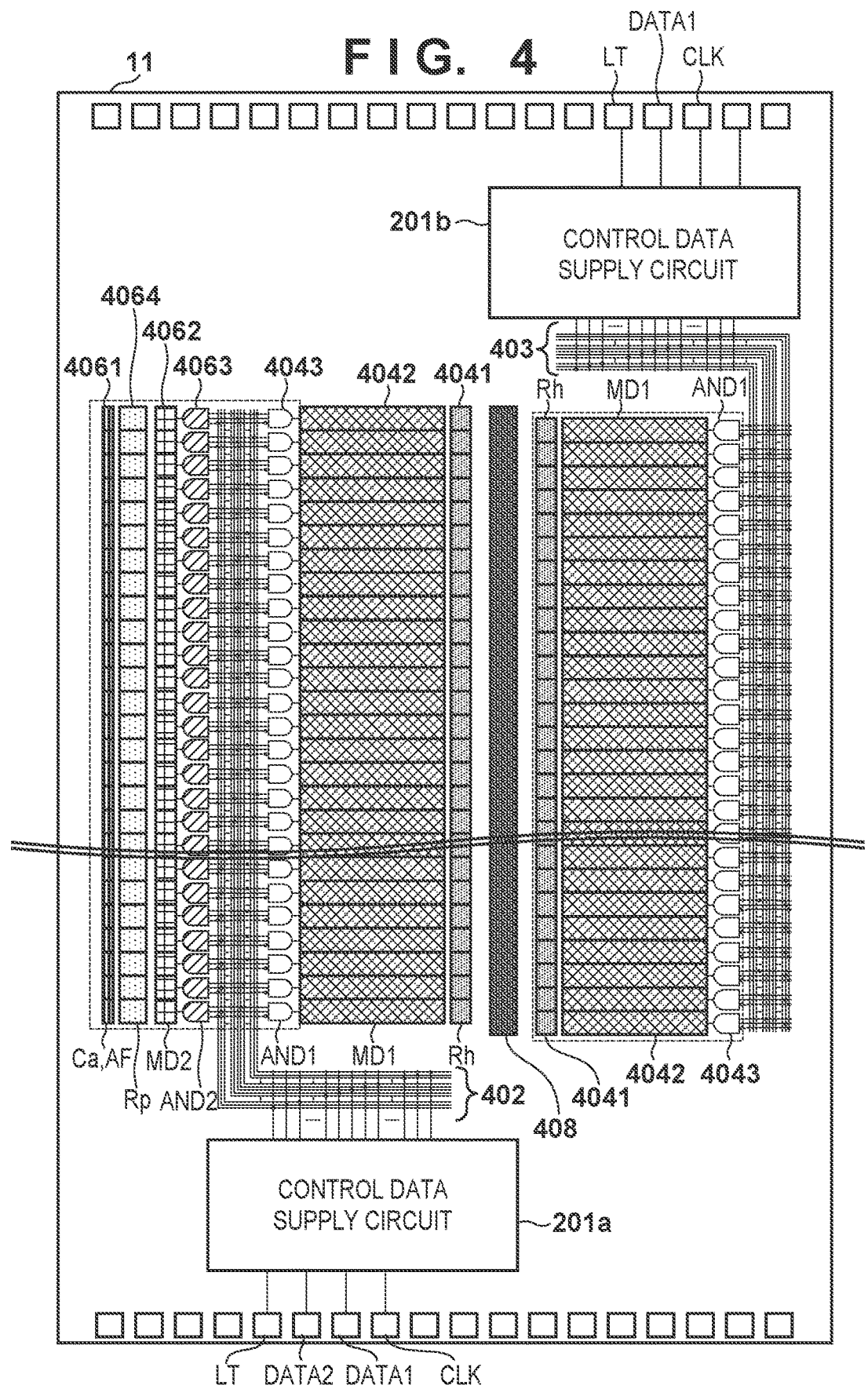
FIG. 4 is a plan view of a print element substrate according to the first embodiment of the present invention.

FIG. 4 is a plan view of a print element substrate 11 according to the first embodiment of the present invention.

The substrate 11 includes, as input terminals, a terminal configured to input a latch signal (LT), a clock input terminal configured to input a shift clock signal (CLK), a data input terminal configured to input a serial data signal (DATA1 and DATA3), and an input terminal configured to input a bit data signal (DATA2).

The substrate 11 includes a plurality of groups of print element modules and a plurality of groups of memory element modules. Each print element module includes a print element Rh, a driving element MD1 configured to energize and drive the print element, and an AND circuit AND1 for print element selection. Also, each memory element module includes an anti-fuse element AF (also shown as a "capacitance element Ca" in FIG. 4) serving as a memory element, a driving element MD2 for memory element, and an AND circuit AND2 for memory element selection.

Furthermore, a common logic bus wiring 402 (common wiring) capable of supplying signals from a control data supply circuit 201a to the AND circuits AND1 and the AND circuits AND2 is mounted. The control data supply circuit 201a is the same circuit as the circuit shown in FIG. 7. In the first embodiment, the common logic bus wiring 402 includes the group selection signal 210, the block selection signal 211 for print element selection, and the block selection signal 212 for memory element selection, which are output from the control data supply circuit 201 described with reference to FIG. 1.

The arrays of elements and circuits on the substrate 11 will be described first.

The substrate 11 is provided with a supply port 408 that extends in the longitudinal direction of the substrate 11 and supplies ink serving as a printing material. Along the extending direction of the supply port 408, a print element array 4041 formed by arraying the plurality of print elements Rh in at least one array is provided. Additionally, on a side of the print element array 4041 opposite to the side where the supply port 408, a driving element array 4042 for print element, which is formed by arraying the driving elements MD1 for print element corresponding to the print elements Rh, is provided adjacent to the print element array 4041. Also, an AND circuit array 4043 for print element selection, which is formed by arraying the AND circuits AND1 for print element selection corresponding to the print elements Rh, is provided adjacent to the driving element array 4042. Note that in the first embodiment, the print element array 4041, the driving element array 4042, and the AND circuit array 4043 extend along the Y direction shown in FIG. 4.

Similarly, an anti-fuse element array 4061 (memory element array) formed by arraying the plurality of anti-fuse elements AF (capacitance elements Ca) along the direction of the print element array 4041 is provided on the substrate 11. The anti-fuse element array 4061 is provided near an edge portion of the substrate 11. In addition, a resistive element array 4064 formed by arraying resistive elements Rp corresponding to the anti-fuse elements AF is provided adjacent to the anti-fuse element array 4061. Furthermore, a driving element array 4062 formed by arraying the driving elements MD2 for memory element selection corresponding to the anti-fuse elements AF is provided adjacent to the resistive element array 4064. Also, a logic circuit array 4063 formed by arraying the logic circuits AND2 for memory element selection corresponding to the anti-fuse elements AF is provided adjacent to the driving element array 4062.

The above-described common logic bus wiring 402 is provided between a discharge module array including the print element array 4041 and the arrays of elements and circuits for print element and a memory module array including the memory element array and the arrays of elements and circuits for memory element. In the first embodiment, the common logic bus wiring 402 extends in the direction of the print element array 4041. The logic circuit array 4043 for print element and the logic circuit array 4063 for memory element extend along the extending direction of the common logic bus wiring 402. In other words, the common logic bus wiring 402, the logic circuit array 4043 for print element, and the logic circuit array 4063 for memory element extend along the Y direction in FIG. 4. In addition, the logic circuit array 4063 for memory element, the common logic bus wiring 402, and the logic circuit array 4043 for print element are arranged in this order in the X direction from the left side of FIG. 4. Also, the control data supply circuit 201 (201a) is arranged at an end portion of the substrate 11 in the Y direction.

Additionally, on the substrate 11, the print element array 4041, the driving element array 4042, and the logic circuit array 4043 are provided on each side (X direction) of the supply port 408. One anti-fuse element array 4061 is provided on one side of the supply port 408. Hence, one print element array 4041 (the left side of FIG. 4) of the two print element arrays 4041 shares the common logic bus wiring 402 with the anti-fuse element array 4061.

On the other hand, the other print element array 4041 (the right side of FIG. 4) is connected to a control data supply circuit 201b via a logic bus wiring 403 dedicated to a print element array. The logic bus wiring 403 dedicated to a print element array includes the group selection signal 210 and the block selection signal 211 for print element selection. Note that the print element array 4041, the driving element array 4042, and the logic circuit array 4043 may be provided on only one side of the supply port 408.

Figure 8:
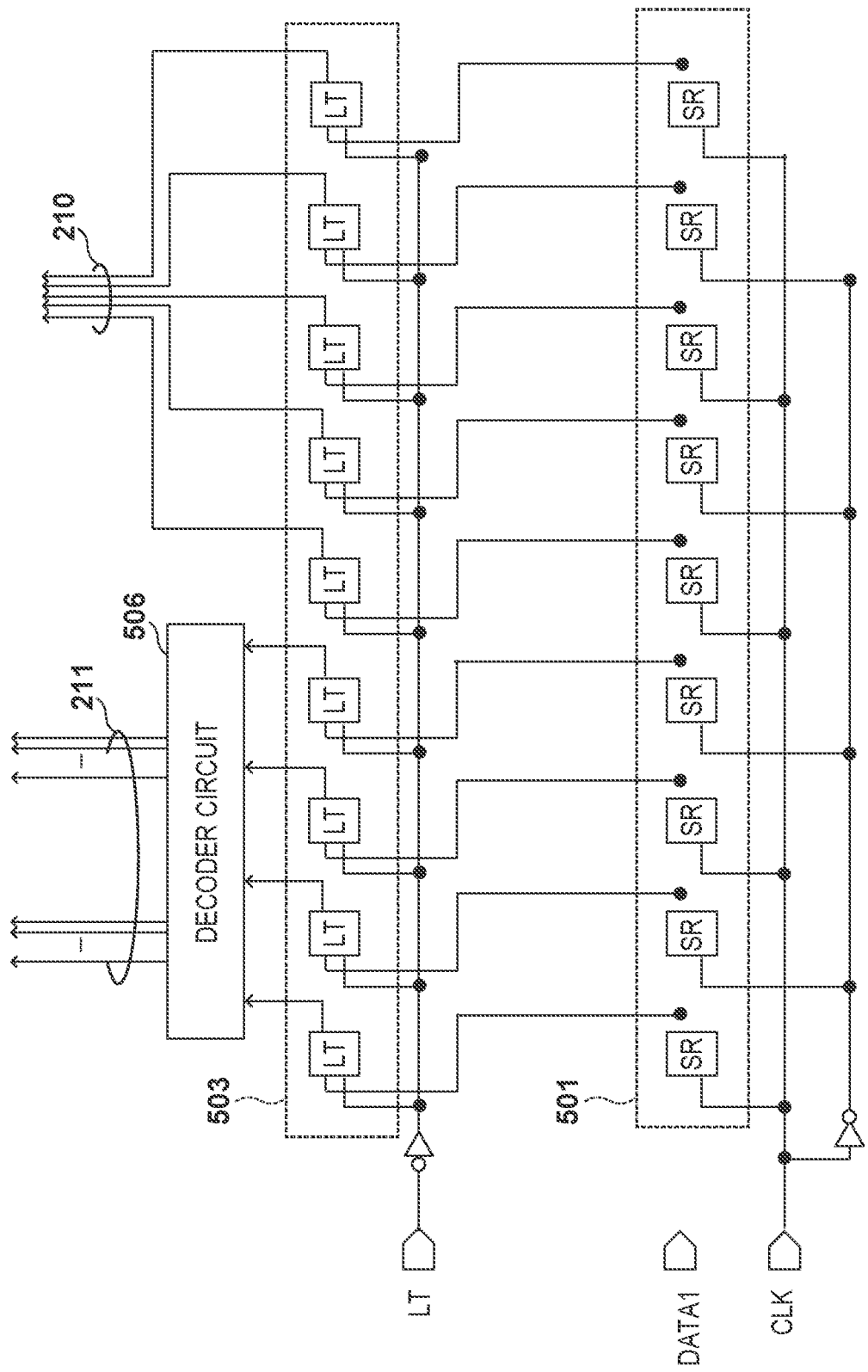
FIG. 8 is a view showing an example of the circuit configuration of a control data supply circuit 201b according to the first embodiment.

FIG. 8 is a view showing an example of the circuit configuration of the control data supply circuit 201b according to the first embodiment.

In the control data supply circuit 201b, the signal DATA2 and the mask circuit 505 shown in FIG. 7 are omitted, and the decoder circuit 506 outputs only the block selection signal 211 for print element selection.

The configurations of the control data supply circuits 201a and 201b according to the first embodiment have been described above with reference to FIGS. 7 and 8. The operations of the circuits will mainly be described here.

In the example shown in FIG. 7, the decoder circuit 506 operates as a multiplexer configured to receive a signal of a plurality of bits, here, a 4-bit signal, decode that, and outputs 16 selection signals. If the output of the second latch circuit 504 is at low level, the selection signal 211 for selecting a group of print elements is output. If the output of the second latch circuit 504 is at high level, the selection signal 212 for selecting a group of memory elements is output. In the example shown in FIG. 7, there exist five blocks for both the print elements and the memory elements, and each block includes 16 elements.

Also, in FIG. 8, the second latch circuit 504, the data mask circuit 505, the second shift register circuit 502, the block selection signal 212 for memory element selection, and the signal DATA2 shown in FIG. 7 do not exist.

Figure 10A:
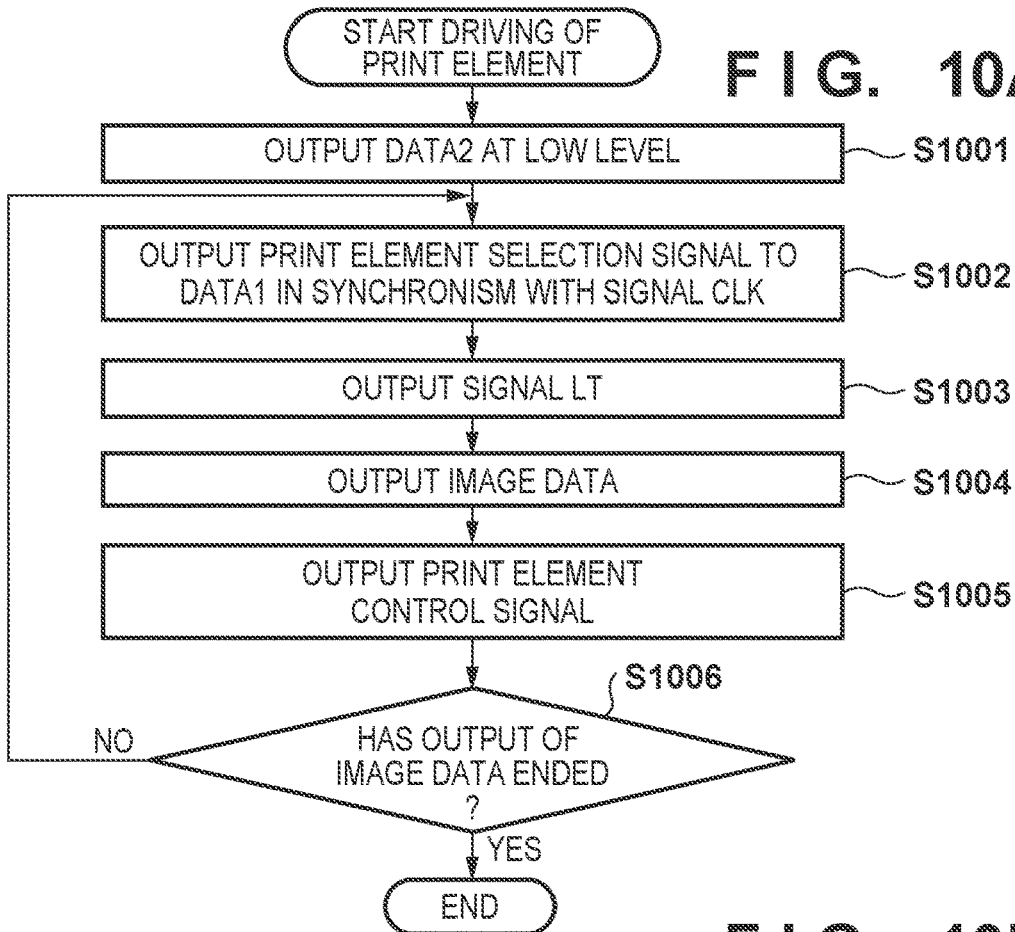
FIG. 10A is a flowchart for explaining processing of controlling the printhead when the printing apparatus according to the first embodiment performs print processing of one line.

FIG. 10A is a flowchart for explaining processing of controlling the control data supply circuit 201a when a printing apparatus 1000 according to the first embodiment performs print processing of one line. Note that the processing shown in the flowchart is achieved by a CPU 901 reading out a program stored in a ROM 903 and executing it. Note that processing of controlling the control data supply circuit 201b is the same as conventional processing, and a description thereof will be omitted.

First, in step S1001, the CPU 901 changes DATA2 to low level. Next, the process advances to step S1002, and the CPU 901 outputs a 10-bit serial signal to DATA1 in synchronism with the signal CLK. In step S1003, the latch signal LT is output, and the first latch circuit 503 latches the 10-bit data set in the first shift register circuit 501. At this time, since DATA2 is at low level, data in the second shift register circuit 502 is not latched by the second latch circuit 504. At this time, one group of print elements is selected by the second to sixth upper bits, and a block of print elements included in the group selected by the upper bits is selected by the seventh to 10th lower bits. This decides the print elements to be driven in the printing operation. In step S1004, image data to be printed at that time is output. The process advances to step S1005, and the CPU 901 outputs, to the printhead unit 20, a print element control (heat enable (HE)) signal for driving the print elements. Hence, print elements as many as the maximum number of groups are simultaneously driven by one driving of print elements. The process advances to step S1006, and, for example, it is determined whether output of image data corresponding to one line is ended. If the output is not ended, the process returns to step S1002 to execute the above-described processing.

Figure 10B:
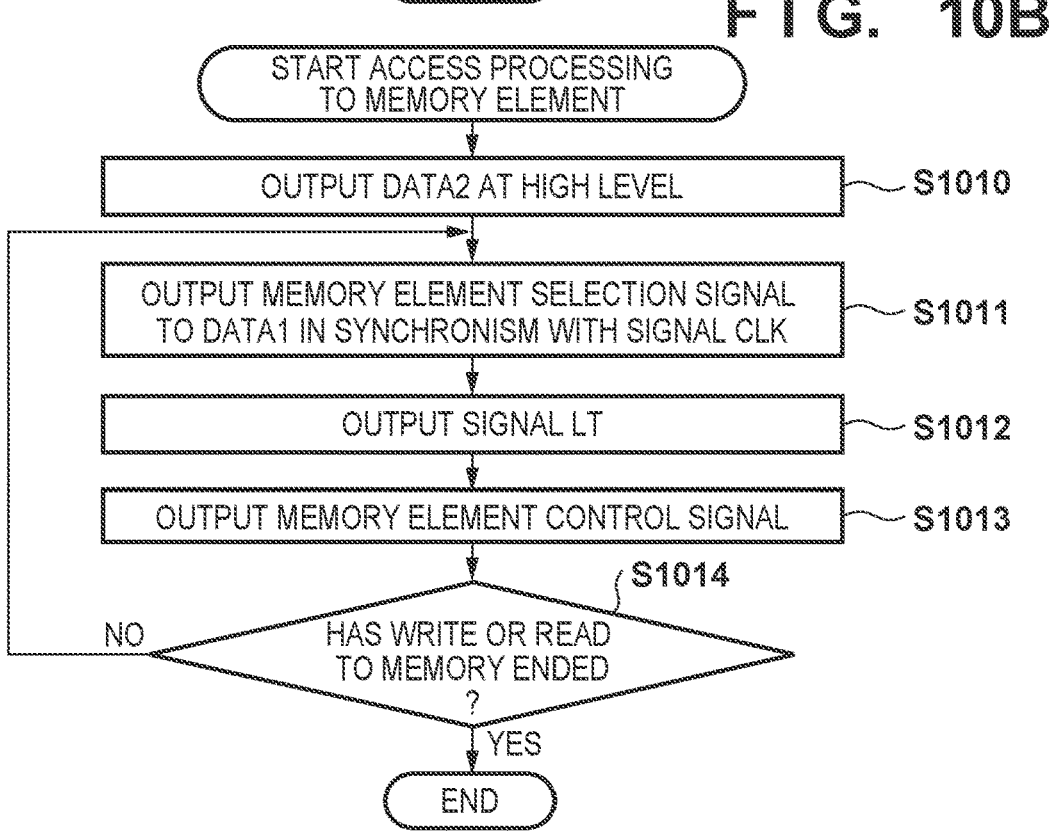
FIG. 10B is a flowchart for explaining processing of controlling the printhead when the printing apparatus according to the first embodiment performs access processing to a memory module.

FIG. 10B is a flowchart for explaining processing of controlling the control data supply circuit 201a when the printing apparatus 1000 according to the first embodiment performs access processing to a memory module. Note that the processing shown in the flowchart is achieved by the CPU 901 reading out a program stored in the ROM 903 and executing it. Note that in the access processing to a memory module, the control data supply circuit 201b is not used.

First, in step S1010, the CPU 901 changes DATA2 to high level. Next, the process advances to step S1011, and the CPU 901 outputs a 10-bit serial signal to DATA1 in synchronism with the signal CLK. In this case, however, the first bit of the 10-bit serial signal is set to high level. In step S1012, the latch signal LT is output, and the first latch circuit 503 latches the 10-bit data set in the first shift register circuit 501. At this time, since DATA2 is at high level, high-level data ("1") in the second shift register circuit 502 is latched by the second latch circuit 504. At this time, one group of memory elements is selected by the second to sixth upper bits, and a block of memory elements included in the group selected by the upper bits is selected by the seventh to 10th lower bits. This decides the memory elements as the read or write target. In step S1013, a memory control signal is output, thereby enabling data write/read to/from the memory elements. The process advances to step S1014, and the CPU 901 determines whether the data write/read to/from the memory elements is ended. Upon determining that the data write/read is ended, the processing is ended. Upon determining that the data write/read is not ended, the process returns to step S1011 to execute the above-described processing.

In the first embodiment, there exist, for example, five blocks of memory elements, and each block includes 16 memory elements. Hence, when accessing the memory elements, the CPU 901 of the printing apparatus 1000 sets DATA2 to high level and outputs the 10-bit serial signal whose first bit is "1" to DATA1 in synchronism with the signal CLK. Then, the latch signal LT is output, and the first latch circuit 503 latches the 10-bit data set in the first shift register circuit 501. At this time, since DATA2 is at high level, the second latch circuit 504 latches the data in the second shift register circuit 502. At this time, one group of memory elements is selected by the second to sixth upper bits, and a block of memory elements included in the group selected by the upper bits is selected by the seventh to 10th lower bits.

As described above, according to the first embodiment, to use the print elements for printing, the output of the second shift register circuit 502 is masked by the signal DATA2 and is not sent to the decoder circuit. For this reason, if the signal DATA2 is at low level, the decoder circuit always outputs a selection signal for selecting a block of print elements. Hence, it is possible to decrease the number of bits of the signal for selecting print elements, as compared to the conventional technique.

SECOND EMBODIMENT

Figure 5:
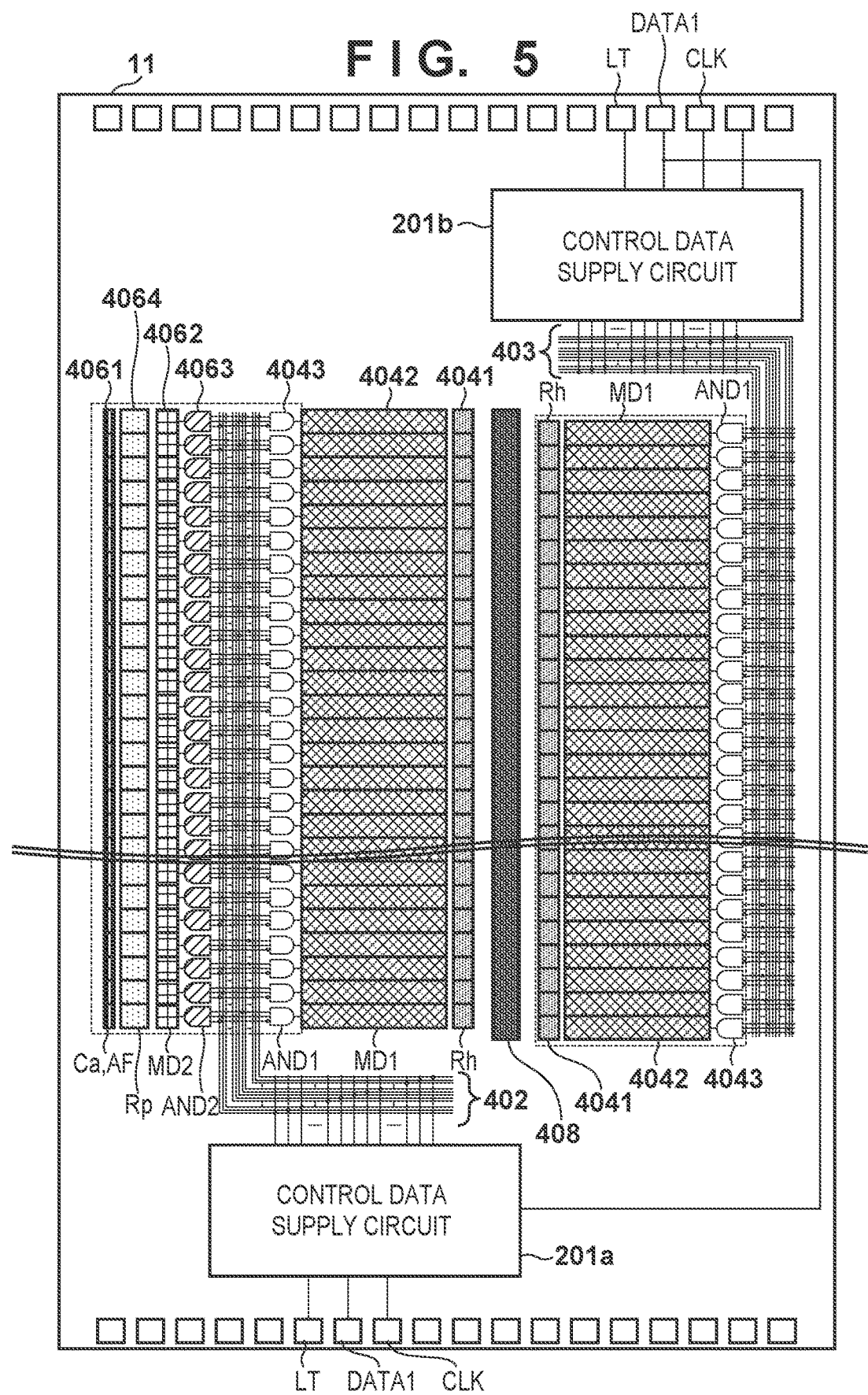
FIG. 5 is a plan view of a print element substrate according to the second embodiment of the present invention.

FIG. 5 is a plan view of a print element substrate 11 according to the second embodiment of the present invention.

In the print element substrate shown in FIG. 4 according to the above-described first embodiment, the control data supply circuit 201a uses the signal DATA2 for image data.

In the second embodiment, however, a signal DATA4 for image data used in a control data supply circuit 201b is supplied as the above-described DATA2 to a control data supply circuit 201a. Hence, in the substrate 11 according to the second embodiment, output of a block selection signal for print element from the control data supply circuit 201a is inhibited (masked) only by one signal DATA4.

As described above, according to the second embodiment, the number of signal lines input to the element substrate is decreased from two to one, that is, the signal DATA3 and the signal DATA2 shown in FIG. 4 are changed to only the signal DATA4, thereby decreasing the number of electrode pads of the substrate. Alternatively, excess electrode pads can be used for another application purpose.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-040697, filed Mar. 12, 2021, which is hereby incorporated by reference herein in its entirety.

What is claimed is:

1. An element substrate, comprising:
   a plurality of groups of print elements;
   a plurality of groups of memory elements;
   a plurality of stages of shift registers configured to input and hold a serial data signal;
   a latch circuit configured to latch the serial data held by the shift registers;
   a decoder circuit configured to input an output of the latch circuit and output a selection signal for selecting a block of the print elements or the memory elements; and
   a mask circuit configured to mask the output of the selection signal for selecting the block of the memory elements from the decoder circuit in accordance with an input bit data signal, wherein
   the block of the print elements or the memory elements includes a plurality of print elements or memory elements in which one element is selected in each of the plurality of groups, and
   the memory elements are one time programmable memory elements, each of which stationary holds information and functions as a memory that can be programmed only once.

2. The substrate according to claim 1, wherein the group of the print elements or the memory elements is selected by a part of the output of the latch circuit, and
   the selection signal for selecting the block of the print elements or the memory elements is a 1-bit signal obtained by the decoder circuit decoding a part of a rest of the output of the latch circuit.

3. The substrate according to claim 1, wherein the bit data signal is a 1-bit data signal input via a data input terminal.

4. The substrate according to claim 1, further comprising a clock input terminal configured to input a shift clock signal for inputting the serial data signal and inputting the serial data signal to the shift register.

5. The substrate according to claim 1, further comprising a latch signal input terminal configured to input a latch signal for causing the latch circuit to latch the serial data.

6. The substrate according to claim 1, wherein the mask circuit is configured to mask output of first bit data of the shift register to a first latch circuit of the latch circuit, and
   an output of the first latch circuit of the latch circuit is input to the decoder circuit as an output selection signal of the decoder circuit.

7. The substrate according to claim 6, wherein the decoder circuit outputs the selection signal for selecting the block of the print elements when the mask circuit masks the first bit data of the shift register.

8. The substrate according to claim 1, wherein the decoder circuit includes a multiplexer configured to input a data signal of a plurality of bits and output a 1-bit selection signal obtained by decoding the data signal of the plurality of bits.

9. The substrate according to claim 1, wherein the print element includes an electrothermal transducer configured to generate heat by energization, a first transistor configured to energize and drive the electrothermal transducer, and a logic circuit configured to input a block selection signal for the print elements, a group selection signal for the print elements, and a control signal for the print elements and control driving of the first transistor.

10. The substrate according to claim 1, wherein the memory element includes an anti-fuse element configured to perform write or read of information by energization, a second transistor configured to energize the anti-fuse element, and a logic circuit configured to input a block selection signal for the memory elements, a group selection signal for the memory elements, and a control signal for the memory elements and control driving of the second transistor.

11. A liquid discharge head comprising the element substrate defined in claim 1.

12. A printing apparatus for performing printing using the liquid discharge head defined in claim 11.

13. An element substrate, comprising:
   a plurality of groups of print elements;
   a plurality of groups of memory elements;
   a first control data supply circuit configured to output a selection signal for selecting a block of the print elements; and
   a second control data supply circuit configured to output a selection signal for selecting a block of the print elements and a selection signal for selecting a block of the memory elements;
   each of the first control data supply circuit and the second control data supply circuit including (i) a plurality of stages of shift registers configured to input and hold a serial data signal, (ii) a latch circuit configured to latch the serial data held by the shift registers and (iii) a decoder circuit configured to input an output of the latch circuit and output the selection signal for selecting the block of the print elements or the memory elements; and
   the second control data supply circuit including a mask circuit configured to mask the output of the selection signal for selecting the block of the memory elements from the decoder circuit in accordance with an input bit data signal, wherein
   the block of the print elements or the memory elements including a plurality of print elements or memory elements in which one element is selected in each of the plurality of groups, and
   the memory elements are one time programmable memory elements, each of which stationary holds information, and functions as a memory that can be programmed only once.

14. A liquid discharge head comprising the element substrate defined in claim 11.

15. A printing apparatus for performing printing using the liquid discharge head defined in claim 14.

16. An element substrate, comprising:
a plurality of groups of print elements;
a plurality of groups of memory elements;
a first control data supply circuit configured to output a selection signal for selecting a block of the print elements; and
a second control data supply circuit configured to output a selection signal for selecting a block of the print elements and a selection signal for selecting a block of the memory elements;
each of the first control data supply circuit and the second control data supply circuit including (i) a plurality of stages of shift registers configured to input and hold a serial data signal, (ii) a latch circuit configured to latch the serial data held by the shift registers and (iii) a decoder circuit configured to input an output of the latch circuit and output the selection signal for selecting the block of the print elements or the memory elements; and
the second control data supply circuit including a mask circuit configured to mask the output of the selection signal for selecting the block of the memory elements from the decoder circuit in accordance with the serial data signal input to the first control data supply circuit, wherein
the block of the print elements or the memory elements includes a plurality of print elements or memory elements in which one element is selected in each of the plurality of groups, and
the memory elements are One Time Programmable memory elements, each of which stationary holds information, and functions as a memory that can be programmed only once.

17. A liquid discharge head comprising the element substrate defined in claim 16.

18. A printing apparatus for performing printing using the liquid discharge head defined in claim 17.

* * * * *